July 25, 1967 A. A. VALDETTARO 3,333,210

LOCAL OSCILLATOR TUNING UNIT AND REMOVABLE SUBCHASSIS ARRANGEMENT THEREFOR

Filed Nov. 24, 1964

INVENTOR.
ALARICO A. VALDETTARO

BY Mason, Kolehmainen, Rathburn & Wyss.
ATTORNEYS.

3,333,210

LOCAL OSCILLATOR TUNING UNIT AND REMOVABLE SUBCHASSIS ARRANGEMENT THEREFOR

Alarico A. Valdettaro, Bloomington, Ind., assignor to Sarkes Tarzian, Inc., Bloomington, Ind., a corporation of Indiana Filed Nov. 24, 1964, Ser. No. 413,415
5 Claims. (Cl. 331—97)

The present invention relates to oscillators, and more particularly to an improved local oscillator tuning unit for a U.H.F. television tuner.

One type of U.H.F. television tuner used in the past comprises a unitary housing forming individual compartments enclosing an antenna tuning unit, a mixer tuning unit and a local oscillator tuning unit, which tuning units are coupled to one another in known fashion to develop an intermediate frequency output signal. The local oscillator tuning unit of this type of tuner customarily comprises a resonant tank circuit arranged in the housing compartment and equipped with means for tuning the resonant frequency by varying inductive or capacitive elements. Associated with the oscillator tank circuit are an electronic oscillator tube and other circuit elements which may be mounted internally or externally of the tuner housing. An example of this type of U.H.F. tuner may be found in the Krepps Patent No. 2,871,358, assigned to the same assignee as the present invention.

In local oscillator tuning units used in the past, vacuum tube amplifiers frequently have been employed. Such a vacuum tube normally is held in a tube socket permanently mounted on the housing of the tuner, and due to its size, the vacuum tube usually protrudes outwardly from the tuner housing. In accordance with the modern trend toward miniaturization, it has been suggested that a transistor be used in place of the vacuum tube to develop oscillations. It is an important object of the present invention to provide a new and improved local oscillator turning unit employing a transistor arranged in a compact and convenient fashion.

In local oscillator tuning units of the type described, it is necessary to adjust the tuning range of the variable reactive load to the proper limits required by the U.H.F. tuner. One way that this has been accomplished in the past is by means of trimming and padding capacitors. However, such arrangements are generally subject to the disadvantage that adjustment of the high frequency end of the tuning range is not independent of the adjustment at the low end of the tuning range, thus necessitating repeated alignment operations to adjust the high and low ends of the tuning range properly. It is another important object of the present invention to provide a new and improved U.H.F. local oscillator tuning unit including novel means for adjusting the frequency at one end of the tuning range independently of the frequency adjustment at the other end of the tuning range.

It is another object of the present invention to provide an improved local oscillator tuning unit adapted for economical mass production assembly methods.

It is another object of the present invention to provide an improved local oscillator tuning unit including a removable subchassis carrying a transistor and other circuit components of the oscillator.

A further object of the present invention is to provide an improved local oscillator tuning unit including a novel subchassis arrangement whereby a transistor and other related circuit components may be pretested before final assembly of the unit.

It is still another object of the present invention to provide an improved local oscillator tuning unit characterized by the fact that testing and repair in the field are greatly facilitated.

It is yet another object of the present invention to provide an improved local oscillator tuning unit having certain circuit components mounted on a removable subchassis to the end that these circuit components may be altered or replaced to suit the requirements of different users without redesigning the entire oscillator tuning unit.

It is another object of the invention to provide an improved transistorized local oscillator tuning unit wherein the transistor amplifier may be installed, removed, and replaced without damage.

It is another object of the present invention to provide a subchassis assembly for insertion into a local oscillator tuning unit compartment and having novel means for confining oscillations within the compartment.

Another object of the invention is to provide a local oscillator tuning unit including novel means whereby the high and low ends of the frequency range of the oscillator may be adjusted independently.

The invention, both as to its organization and method of operation, together with further objects and advantages, will best be understood by reference to the following specification taken in connection with the accompanying drawing in which.

Figures 1, 2, 3, 4, 5, 6:
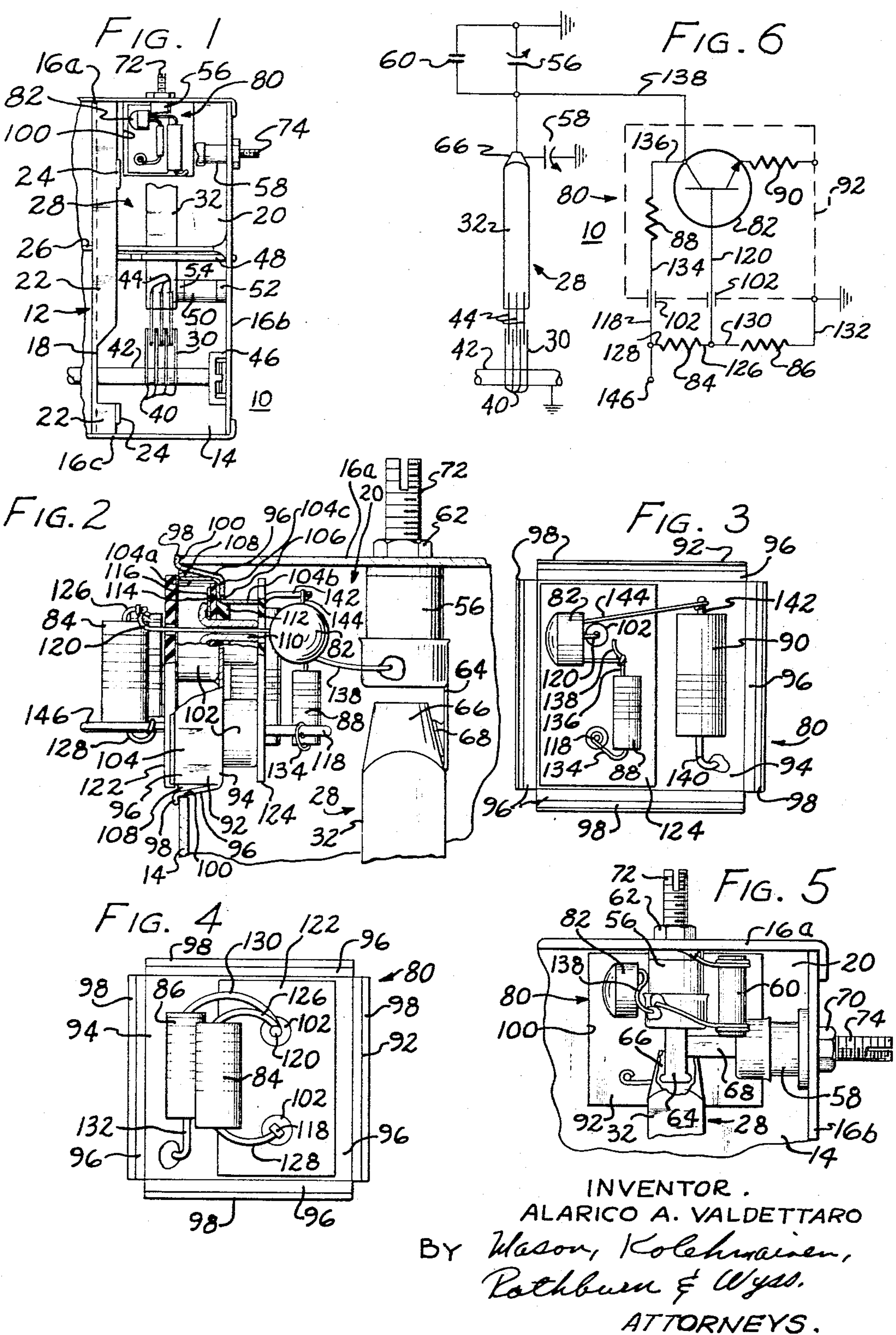
FIG. 1 is a top plan view of a local oscillator tuning unit portion of a U.H.F. tuner constructed in accordance with the present invention, and with some of the structure broken away.
FIG. 2 is an enlarged fragmentary left side view, partly in section, of a portion of the local oscillator tuning unit illustrated in FIG. 1.
FIG. 3 is an enlarged top plan view of the subchassis assembly of the local oscillator tuning unit of FIG. 1.
FIG. 4 is a bottom plan view of the apparatus of FIG. 3.
FIG. 5 is an enlarged fragmentary view of a portion of the local oscillator tuning unit of FIG. 1 assuming FIG. 1 to show the complete structure.
FIG. 6 is a schematic diagram of the local oscillator tuning unit of FIG. 1.

Referring now to the drawing, and more particularly to FIG. 1 thereof, there is illustrated a local oscillator tuning unit, indicated generally at 10, of the type comprising one portion of a U.H.F. tuner having a unitary housing 12, only a portion of which is shown in the drawing. The housing 12 includes a bottom wall 14 and illustrated side walls **16*a*, 16*b* and 16*c*, as well as several partition walls 18, only one of which is illustrated. The bottom wall 14, the side walls 16*a*, 16*b* and 16*c* and the illustrated partition 18 cooperate to form a compartment 20 housing the local oscillator tuning unit 10. It should be understood that the walls 14, 16*a*, 16*b* and 16*c* and other partitions 18 form other compartments (not shown) of the U.H.F. tuner for housing other sections of the tuner such as an antenna or R.F. tuner unit and a mixer tuning unit. Furthermore, the unitary housing 12 may include a cover member (not shown) for enclosing the various compartments, including the local oscillator tuning unit compartment 20. To this end the partition 18 includes a pair of mounting flanges 22, each including a locking tab 24** for holding a cover in place.

In order to provide a rigid chassis structure, the housing 12 is provided with a tie bar 26 extending across the tops of the various compartments of the tuner, including the illustrated compartment 20. The tie bar is securely fixed to the wall **16*b* and the partition 18** as by soldering or staking.

The local oscillator tuning unit 10 includes a tank circuit assembly 28 disposed in a generally central position within the compartment 20, as best illustrated in FIGS. 1, 2 and 5 of the drawing. The reactive elements of the tank circuit include a main tuning capacitor 30 and a bar or block-shaped member, or transmission line member 32 effective as an inductance at the normal operating frequencies of the oscillator.

In order to vary the frequency of the oscillations developed in the tank circuit 28 in accordance with the requirements of the U.H.F. tuner, the main tuning capacitor 30 includes condenser rotor plates 40 mounted on a rotatable shaft 42 extending through the compartment 20 and through other portions of the U.H.F. tuner. The condenser rotor plates 40 cooperate with fixed condenser plates 44 mounted at one end of the bar-shaped inductance member 32, and as the shaft 42 is rotated, the change thus produced in the capacitive element of the tank circuit 28 will cause the resonant frequency of the tank circuit 28 to vary within a range of frequencies in known fashion. It will be understood that the rotation of the shaft 42 may also control the tuning of the antenna tuning unit and the mixer tuning unit of the U.H.F. tuner. One end of the shaft 42 is journaled in a bearing assembly 46 mounted on the wall 16*b*, whereby the shaft 42 and the condenser rotor plates 40 are grounded to the chassis 12.

In order to rigidly mount the bar-shaped inductive element 32 centrally within the compartment 20, a supporting wall 48 of insulating material is positioned across the compartment 20, extending between the partition 18 and the wall 16*b*. The supporting wall 48 includes an opening which snugly receives the bar-shaped member 32. Furthermore, a support arm 50 spans the space between the wall 16*b* and the end of the bar-shaped member 32 firmly to hold the bar-shaped member 32 and the fixed condenser plates 44 in their proper positions. The support arm 50 carries a pair of metal end caps 52 and 54 soldered into position against wall 16*b* and the bar 32. Although some capacitance exists between the end caps 52 and 54, its value is so small as to be negligible as compared with the other circuit elements of the oscillator 10.

In order to align the local oscillator tuning unit 10, at the high and low ends of the U.H.F. tuning range independently of the main tuning condenser 30, the tank circuit 28 includes a pair of variable trimming condensers 56 and 58, and a fixed condenser 60 (FIG. 5). The condenser 56 is mounted and grounded by means of a threaded fastener 62 (FIG. 2) to the wall 16*a* and is positioned in line with the bar-shaped member 32. An extending solder lug 64 on the condenser 56 extends into the compartment 20 and is electrically connected by soldering to a reduced end portion 66 of the bar-shaped member 32. The fixed condenser 60 is mounted in parallel with the condenser 56 and may have a suitable temperature coefficient to provide temperature compensation, as will be readily understood by those skilled in the art.

In the oscillator tank circuit the member 32 forms the inductive branch of the tank circuit and the capacitive branch is formed by the capacitors 56 and 60, connected in parallel, this parallel combination being connected in series with the main tuning capacitor 30. However, the common junction of the capacitors 30, 56 and 60 is the ground plane provided by the chassis 12 so that the ground point constitutes essentially a tap on the oscillator tank circuit. This means that there will be a corresponding virtual ground point along the length of the inductive branch 32, the location of this virtual ground being determined by the relative capacitance of the capacitor 30 and the parallel combination 56, 60. Furthermore, this virtual ground point moves along the tank circuit as the main tuning capacitor is adjusted over the U.H.F. tuning range. In this connection, it will be noted that the inductive member 32 and the solder lug extension 64 of the trimming capacitor 56 are positioned in line with one another so that the lug 64 functions in the tank circuit 28 as an extension of the inductive member 32. Furthermore, since end portion 66 of the member 32 and lug 64 are smaller in cross section than the body of member 32, a relatively large proportion of the total inductance exists in these members.

In accordance with an important feature of the present invention, the variable trimming capacitor 58 is connected to the inductive branch of the oscillator tank circuit at a point which corresponds to the position of the above discussed virtual ground when the capacitor 30 is at one end of the frequency range of the oscillator. Specifically, the tank circuit 28 is designed in accordance with this feature of the invention so that when the main tuning condenser is opened as far as possible, and the frequency of the oscillations developed in the tank circuit is at the high frequency end of the range, the virtual ground will be positioned at the reduced end 66 of the bar-shaped element 32. A solder lug 68 of the trimmer capacitor 58 is soldered at this point, while the capacitor 58 is mounted transversely of the member 32 and is grounded to the wall 16*b* by a fastener 70 (FIG. 5).

Because of this novel arrangement of the trimming capacitors 56 and 58, the tank circuit may be aligned in two simple steps. First, the main tuning capacitor 30 is opened so that the oscillator operates at its highest frequency. At this time, the high frequency tuning of the oscillator may be adjusted to the desired frequency by turning a threaded rotatable shaft 72 of the trimming capacitor 56. Then the main tuning capacitor 30 is closed so that the circuit oscillates at its lowest frequency and an alignment adjustment of the capacitor 58 may be made by means of a shaft 74 associated with this capacitor. This latter adjustment will be effective to change the capacitive reactance of the tank circuit since the virtual ground point has moved away from the connection point of the capacitor 58 to the member 32 when the oscillator is tuned to the low frequency end of its tuning range. However, this alignment of the low frequency end of the band by means of the capacitor 58 does not change the high frequency alignment setting since capacitor 58 is connected to the virtual ground point at the high frequency end of the range. Accordingly, such alignment of either of the capacitors 56 and 58 does not cause misalignment of or interaction on the other one of these capacitors. When the main tuning capacitor 30 is opened so that the oscillator oscillates at its highest frequency, alignment adjustment of the capacitor 58 has no effect on the frequency of oscillation, since the capacitor at this point is effectively shorted to ground.

In accordance with another feature of the present invention, the elements of the oscillator circuit, except for the above described tank circuit 28, are carried on a removable subchassis assembly 80 mounted in the bottom wall 14 of the main tuner chassis 12. The subchassis assembly 80 includes a transistor 82, as well as resistors 84, 86, 88 and 90.

The elements of the subchassis assembly 80 are mounted upon a generally cup-shaped subchassis member 92 having a square bottom wall 94 and four side walls 96 slightly inclined from the perpendicular. Each side wall 96 is provided at its outer edge with a lip 98. In order to receive the subchassis assembly 80, the bottom wall 14 of the main tuner chassis 12 is provided with an opening 100 adapted to tightly receive the subchassis member 92 (FIG. 2). When the subchassis assembly 80 is inserted into the opening 100, the side walls 96 are slightly flexed inwardly and the lips 98 abut against the wall 14 and the edge of the wall 16*a* of the tuner chassis 12, the subchassis 92 being held in place by friction. Thus it can be seen that although the subchassis assembly 80 is readily removable, nevertheless a good ground connection is obtained between the subchassis 92 and the main chassis 12.

In order to support the transistor 82 and resistors 84, 86, 88 and 90 on the subchassis member 92, and in order to provide by-passes to ground at the frequencies of operation of the oscillator, a pair of discoidal feedthrough capacitators 102 are mounted in the bottom wall 94 of the subchassis member 92. Referring to FIG. 2 of the drawing where one of the discoidal feedthroughs 102 is illustrated in section, it can be seen that each discoidal feedthrough 102 includes a generally tubular outer wall 104 having a large diameter portion 104a, a smaller diameter portion 104b and a planar annular wall portion 104c defined therebetween. The bottom wall 94 of the subchassis 92 defines a pair of spaced openings 106 receiving the smaller diameter portions 104b whereby the annular wall 104c rests against the bottom wall 94. The walls 104 of the discoidal feedthroughs 102 are fastened and electrically connected to the subchassis member 92 by means of solder 108.

Considering now the internal structure of the discoidal feedthrough capacitors 102, an elongated annular ferrule 110 is held in a coaxial position by means of a pair of annular insulating washers 112 and 114 which extend outwardly to the wall 104. A thin annular metal washer or plate 116 rests upon the insulating washer 104 in spaced parallel relation to the wall portion 104c of the wall 104 and is held in place by a flattened portion of the ferrule 110.

Each ferrule 110 has a central opening for receiving an electrical conductor passing through the discoidal feedthrough capacitor 102. Thus, a conducting bar or pin 118 is supported in one of the feedthroughs 102 and extends outwardly of the subchassis member 92 on either side thereof. The other feedthrough 102 carries a conductor 120 which is the base lead of the transistor amplifier 82. The respective conductors 118 or 120 passing through the discoidal feedthrough 102 is electrically and mechanically connected to the ferrule 110 by means of solder or the like.

It has been found that the use of the above described discoidal feedthrough capacitors 102 provides a significant advantage over the use of other types of feedthroughs such as tubular feedthroughs. The capacitance between the conductor and the chassis within the feedthroughs 102 exists primarily between the annular wall 104c and the metal disk 116. Tubular type feedthroughs having a pair of concentric cylinders rather than the above described arrangement have been found to act like a transmission line having an effective length much longer than their actual length and to have a resonant frequency close to the frequency range of the oscillator. In contrast, the discoidal feedthrough capacitors 102 have a much higher resonant frequency and consequently effectively act as a by-pass to ground for U.H.F. signals and as an open circuit for D.C. signals.

Considering now the manner in which the transistor 82 and the resistors 84, 86, 88 and 90 are mounted on the subchassis member 92, both the concave or bottom side and the convex or top side of the member 92 are provided with a sheet or layer of insulating material 122 and 124 respectively. The sheets of insulating material 122 and 124 rest against the discoidal feedthrough capacitors 102 and include openings coaxial with the feedthrough capacitors for the passage therethrough of conductors 118 and 120. The resistor 84, having a pair of leads 126 and 128, is mounted on the concave side of the subchassis member 92 with lead 126 being electrically connected to the transistor base lead 120 and the lead 128 being electrically connected to the bar 118. Leads 130 and 132 of the resistor 86 are connected respectively to the transistor base lead 120 and to ground by being soldered to the bottom wall 94.

Referring now to the convex or top side of the subchassis member 92 the resistor 88 has a lead 134 which is electrically connected to the bar 118 and another lead 136 which is electrically connected to a collector lead 138 of the transistor 82. The resistor 90 has a first lead 140 which is connected to ground at the bottom wall 94 of the subchassis member 92 and a second lead 142 which is electrically connected to an emitter lead 144 of the transistor 82.

Thus it can be seen that the transistor 82 and the resistors 84, 86, 88 and 90 cooperate with subchassis member 92 and the discoidal feedthroughs 102 to form a compact and convenient subchassis assembly 80 which can easily be inserted into the opening 100 in the tuner chassis. In order to connect the subchassis assembly 80 with the tank circuit 28 described above, the transistor collector lead 138 is soldered to the solder lug 64 of the trimmer capacitor 56 (FIGS. 2 and 6). In order to complete the fabrication of the local oscillator tuning unit 10 after the subchassis assembly is in place, and in order to provide power to drive the oscillator, a positive D.C. voltage is applied to a terminal 146 formed by the protruding end of the bar 118. Thus the base of the transistor 82 is biased positive by a voltage applied to the base lead 120 through a voltage dividing circuit including the resistors 84 and 86, and a positive voltage is supplied to the collector lead 138 through the resistor 88.

It is pointed out that the subchassis assembly 80 may be pre-assembled independently of the rest of the U.H.F. tuner including the tank circuit 28. This novel construction gives rise to several advantages since the transistor 82 and resistors 84, 86, 88 and 90 may be pre-tested as a unit before final assembly of the tuner, and may easily be removed and tested in the field. Furthermore, the possibility of damage to the transistor 82 during its installation and removal is greatly reduced since it is readily accessible. Also, values of the various resistors may be selected and various types of transistors may be used in order to meet the requirements of different tuner users merely by altering the subchassis assembly 80 without the necessity of making any changes in the rest of the U.H.F. tuner.

The concave or bottom side of the subchassis member 92 carrying the D.C. biasing resistors 84 and 86 is outside the local oscillator tuning unit compartment 20 after assembly. It can now be seen that the discoidal feedthrough capacitors 102 are effective in confining high frequency oscillations developed by the oscillator 10 within the compartment 20, since any such oscillations which may be induced on conductors 118 and 120 are shunted to ground.

In view of the detailed description of the local oscillator tuning unit given above, its operation will be apparent. Referring to FIG. 6, it can be seen that the output of the transistor 82 appearing at its collector is connected to the tank circuit 28 by means of the collector lead 138. Furthermore, the base of the transistor 82 is effectively bypassed to ground by the discoidal feedthrough 102 for signals at oscillation frequency. The emitter electrode is coupled to the subchassis member 92, and thus to ground, by the resistor 90. Coupling between the output and input of the oscillator is accomplished by means of interlead and interelectrode capacitance of the transistor 82. The oscillations produced in the described local oscillator tuning unit 10 may be supplied to the mixer tuning unit of the U.H.F. tuner in any suitable manner, as by inductive coupling, or the like.

While particular embodiments of the invention have been shown, it will be understood, of course, that the invention is not limited thereto since many modifications may be made and it is therefore contemplated by the appended claims to cover any such modifications as fall within the true spirit and scope of the invention.

What is claimed as new and desired to be secured by United States Letters Patent is:

1. A subchassis assembly for insertion into an opening in the chassis wall of the local oscillator tuning unit compartment of a unitary compartmentalized broadcast tuner wherein an oscillator tank circuit is associated with the local oscillator tuning unit compartment, said assembly comprising a cup-shaped subchassis member having a convex side facing into the local oscillator tuning unit compartment and a concave side disposed externally of the local oscillator tuning unit compartment, first circuit means including a transistor, a conductor interconnecting said transistor and the oscillator tank circuit, said first circuit means being mounted on said convex side of said subchassis member, second circuit means mounted on the concave side of said subchassis member, said second circuit means including means for applying biasing potential to said first circuit means, and means including a discoidal feedthrough capacitor mounted on said subchassis member for passing biasing potential through said subchassis member and for bypassing oscillating signals to said subchassis member.

2. A local oscillator tuning unit for a U.H.F. tuner, said local oscillator tuning unit comprising a tuner housing defining a compartment, an oscillator circuit including an amplifier section and a tank circuit, said tank circuit being associated with said compartment and including an elongated transmission line member mounted within said compartment, an opening in a wall of the compartment, a subchassis member removably receivable in said opening, said amplifier section including an electron control device supported on said subchassis member within said compartment, bias means for supplying an operating bias to said electron control device, said subchassis assembly including a terminal adapted to be connected to a source of supply potential, said terminal and at least a part of said bias means being supported on said subchassis member outside said compartment, and means including feedthrough means mounted on said subchassis member for introducing bias and supply potentials through said subchassis member into said compartment and for bypassing U.H.F. signals to said subchassis member.

3. The local oscillator tuning unit of claim 2 wherein said electron control device is a transistor.

4. A local oscillator tuning unit for a U.H.F. tuner, said local oscillator tuning unit comprising a tuner housing defining a compartment, an oscillator circuit including an amplifier section and a tank circuit, said tank circuit being associated with said compartment and including an elongated transmission line member mounted within said compartment, an opening in a wall of the compartment, a subchassis member removably receivable in said opening, said amplifier section including an electron control device and including bias means for supplying an operating bias to said electron control device, said electron control device and said bias means being mounted on and supported by said subchassis member, and means consisting of a single conductor conductively interconnecting said amplifier section and said tank circuit.

5. The local oscillator tuning unit of claim 4, said bias means including a bias resistor supported on said subchassis member outside said compartment, and means including feedthrough means supported by said subchassis member for interconnecting said bias resistor and said electron control device.

References Cited

UNITED STATES PATENTS

| | | | |
|---|---|---|---|
| 2,926,312 | 2/1960 | Brand et al. | 331—117 X |
| 2,964,626 | 12/1960 | Webster et al. | 334—43 |
| 3,031,626 | 4/1962 | Dazey | 331—97 |
| 3,140,444 | 7/1964 | Carlson. | |
| 3,204,198 | 8/1965 | Bachnick | 331—177 X |

FOREIGN PATENTS

| | | |
|---|---|---|
| 246,693 | 9/1963 | Australia. |

OTHER REFERENCES

Bradsell et al.: "Transistor U.H.F. Oscillator," Wireless Word, August 1964, pages 400, 401.

ROY LAKE, *Primary Examiner.*

J. B. MULLINS, *Assistant Examiner.*